United States Patent [19]

Wodarczyk et al.

[11] Patent Number: 5,079,608
[45] Date of Patent: Jan. 7, 1992

[54] POWER MOSFET TRANSISTOR CIRCUIT WITH ACTIVE CLAMP

[75] Inventors: Paul J. Wodarczyk; Frederick P. Jones, both of Mountaintop; John M. S. Neilson, Norristown; Joseph A. Yedinak, Wilkes-Barre, all of Pa.

[73] Assignee: Harris Corporation, Melbourne, Fla.

[21] Appl. No.: 609,685

[22] Filed: Nov. 6, 1990

[51] Int. Cl.$^5$ .......................... H01L 29/78; H02J 9/02
[52] U.S. Cl. ................................ 357/23.13; 357/23.4; 357/13; 361/101
[58] Field of Search .................... 357/23.13, 23.4, 13; 361/101

[56] References Cited

U.S. PATENT DOCUMENTS

| | | | |
|---|---|---|---|
| 4,631,564 | 12/1986 | Neilson et al. | 357/23.4 |
| 4,633,283 | 12/1986 | Avery | 357/23.13 |
| 4,831,424 | 5/1989 | Yoshida et al. | 357/23.4 |
| 4,896,199 | 1/1990 | Tsuzuki et al. | 357/23.4 |

Primary Examiner—Jerome Jackson, Jr.
Attorney, Agent, or Firm—Kenneth Watov

[57] ABSTRACT

A power MOS transistor, including source, drain, and gate electrodes, comprises a substrate of a semiconductor material of one conductivity type having first and second opposed surfaces; a drain region extending through the substrate between the surfaces; a plurality of spaced body regions of the opposite conductivity type extending into the substrate from the first surface; and a source region of the one conductivity type extending into the substrate from the first surface within each of the body regions, the interface of each of the source regions with its respective body region at the first surface being spaced from the interface of its respective body region and the drain region at the first surface to form a channel region therebetween. A gate electrode overlies and is insulated from the first surface and extends across the channel regions. A conductive electrode extends over and is insulated from the gate electrode, and contacts at least a portion of the source regions. A current limiting circuit is coupled between the conductive electrode and the gate electrode and a voltage limiting circuit is coupled between the drain electrode and the gate electrode.

20 Claims, 6 Drawing Sheets

POWER MOSFET TRANSISTOR CIRCUIT WITH ACTIVE CLAMP

FIELD OF THE INVENTION

The present invention relates to a power metal oxide semiconductor field effect transistor (MOSFET) circuit, and more particularly, to a power MOSFET transistor having a circuit integral therewith for protecting the MOSFET transistor against direct short-circuits across a load to the power supply, against drain over-voltage conditions, and against electrostatic discharge (ESD).

BACKGROUND OF THE INVENTION

One type of power MOSFET transistor is known as a vertically diffused MOS (VDMOS) transistor. A transistor of this type is described in U.S. Pat. No. 4,631,564 to J. M. S. Neilson et al., issued Dec. 23, 1986, entitled GATE SHIELD STRUCTURE FOR POWER MOS DEVICE, and herein incorporated by reference.

In certain applications, power MOS transistors may be subject to direct short-circuits across a load to the power supply. In order to provide protection from the consequences of such a short-circuit, current limiting circuits have been utilized with power MOSFETs. An example of such a protection circuit is described in U.S. patent application Ser. No. 447,330, filed Dec. 7, 1989, entitled POWER MOSFET TRANSISTOR CIRCUIT, and herein incorporated by reference.

In the operation of such a protective circuit, it is herein recognized to be desirable to provide further protection from drain over-voltage conditions with an accurate clamp and to protect the power MOSFET from over-voltage transients. It is desirable that a protective circuit can be integrated into the power MOSFET and that it can be constructed using the same process as the power MOSFET.

SUMMARY OF THE INVENTION

In accordance with an aspect of the invention, a power MOS transistor, including source, drain, and gate electrodes, comprises a substrate of a semiconductor material of one conductivity type having first and second opposed surfaces; a drain region extending through the substrate between the surfaces; a plurality of spaced body regions of the opposite conductivity type extending into the substrate from the first surface; and a source region of the one conductivity type extending into the substrate from the first surface within each of the body regions, the interface of each of the source regions with its respective body region at the first surface being spaced from the interface of its respective body region and the drain region at the first surface to form a channel region therebetween. A conductive gate overlies and is insulated from the first surface and extends across the channel regions. A current limiting circuit is coupled between the conductive electrode and the gate electrode and a voltage limiting circuit is coupled between the drain electrode and the gate electrode.

DETAILED DESCRIPTION OF THE PREFERRED EMBODIMENTS OF THE INVENTION

Figure 1:
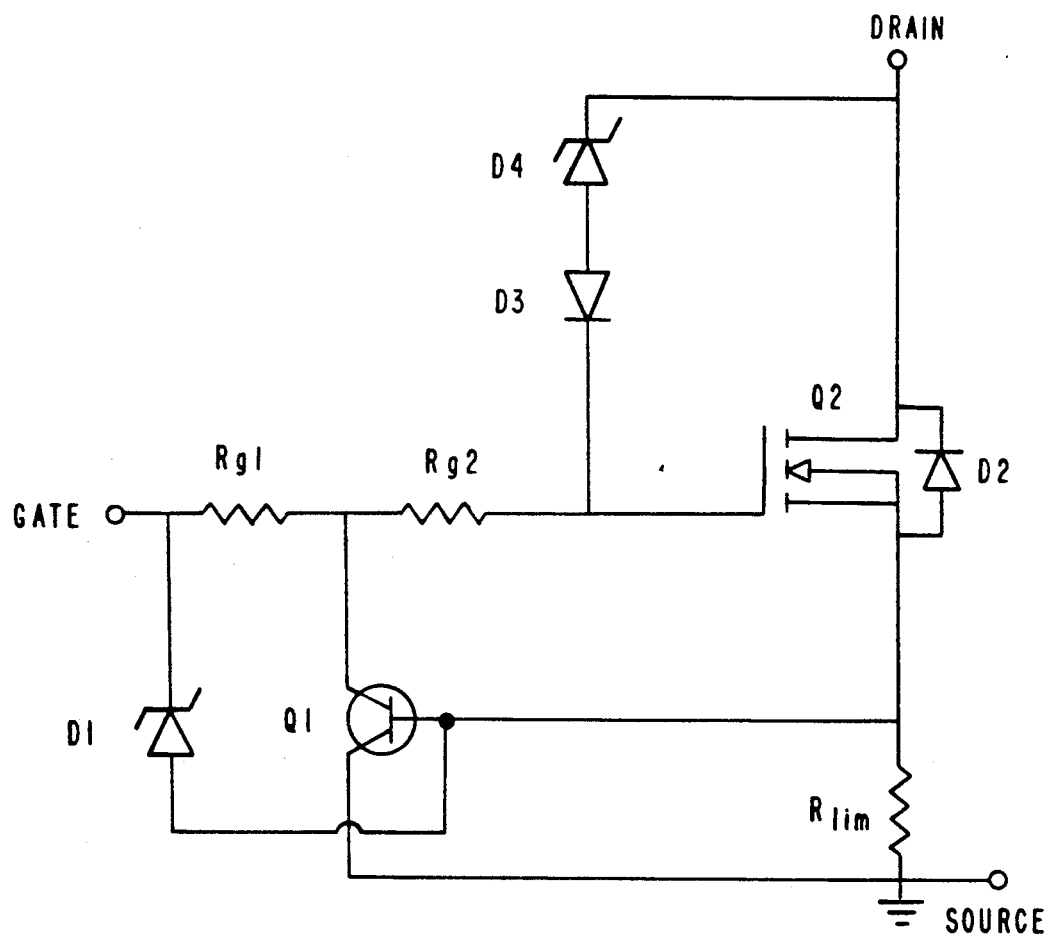
FIG. 1 is a schematic circuit diagram of the MOSFET in accordance with the present invention.

Referring to the exemplary embodiment shown in FIG. 1, $Q_2$ is a power MOSFET having source, drain, and gate electrodes. The drain electrode is connected to a DRAIN terminal and the source electrode is connected to a SOURCE terminal by way of a resistance $R_{lim}$. A GATE terminal has connected thereto the cathode electrode of a zener diode $D_1$ having a breakdown voltage below that which could cause damage to the GATE insulation. The GATE terminal is connected to the gate electrode by way of a series connection of a resistance $R_{g1}$, and a resistance $R_{g2}$. The DRAIN Terminal is also connected to the juncture of $R_{g2}$ and the gate electrode by way of a series connection of a zener diode $D_4$, and a further diode $D_3$ connected in opposite polarity sense to diode $D_4$. A bipolar NPN transistor $Q_1$ has its collector electrode connected to the juncture of resistances $R_{g1}$ and $R_{g2}$, and its emitter and base electrodes connected to respective ends of resistance $R_{lim}$ in a polarity sense such that current in the normal direction of flow through $R_{lim}$ tends to bias transistor $Q_1$ into conduction. The anode electrode of the Zener diode $D_1$ is connected to the base electrode of transistor $Q_1$. A parasitic diode $D_2$ is formed by the structure forming $Q_2$ and is connected between the drain and source electrodes of $Q_2$.

In operation, protection from ESD is provided when the ESD raises the potential of terminal GATE sufficiently to cause $D_1$ to break down and conduct. In the present exemplary embodiment, this is set to occur at about 8 volts. Conduction by $D_1$ causes shunting of current from the GATE terminal through $D_1$, thereby limiting the voltage applied to the gate electrode of power MOSFET transistor $Q_2$ to a safe value.

In the event a load connected to the DRAIN terminal becomes shorted to the supply, a relatively large current will tend to flow through resistance $R_{lim}$, thereby causing a significant voltage drop across it. This voltage drop is applied across the emitter base junction of transistor $Q_1$, thereby biasing it into conduction and causing it to divert current away from the gate electrode of power MOSFET transistor $Q_2$ and thereby limit its gate bias voltage at a level such as to limit its drain current to a safe value.

In the event an over-voltage condition occurs at the DRAIN terminal, it can happen that the voltage at the DRAIN terminal exceeds the sum of the breakdown voltage of zener diode $D_4$, the forward voltage drop of diode $D_3$, and the threshold voltage of power MOSFET transistor $Q_2$. The current flowing through the Zener diode $D_4$ will charge the gate of transistor $Q_2$ and will thereupon cause drain current conduction to take place in transistor $Q_2$, which will thereby be maintained in a safe operating area rather than being subjected to the over-voltage in an open bias or so-called unclamped inductive switch condition.

It may happen during operation that the gate voltage rises higher than the voltage on the drain electrode. When this occurs in the absence of diode $D_3$, current will tend to flow from the gate electrode to the drain electrode by way of diode $D_4$ which thereby becomes forward-biased; this condition is prevented by diode $D_3$ becoming reverse biased.

The series resistance of resistances $R_{g1}$, and $R_{g2}$, operate in conjunction with GATE capacitance to reduce the switching speed of power MOSFET transistor $Q_2$, which otherwise is relatively fast. A lower switching speed is desirable in certain applications for reducing the amount of radio frequency interference (RFI). The relative values of resistances $R_{g1}$, and $R_{g2}$, are selected in accordance with desired specifications relating to device speed.

Figure 2:
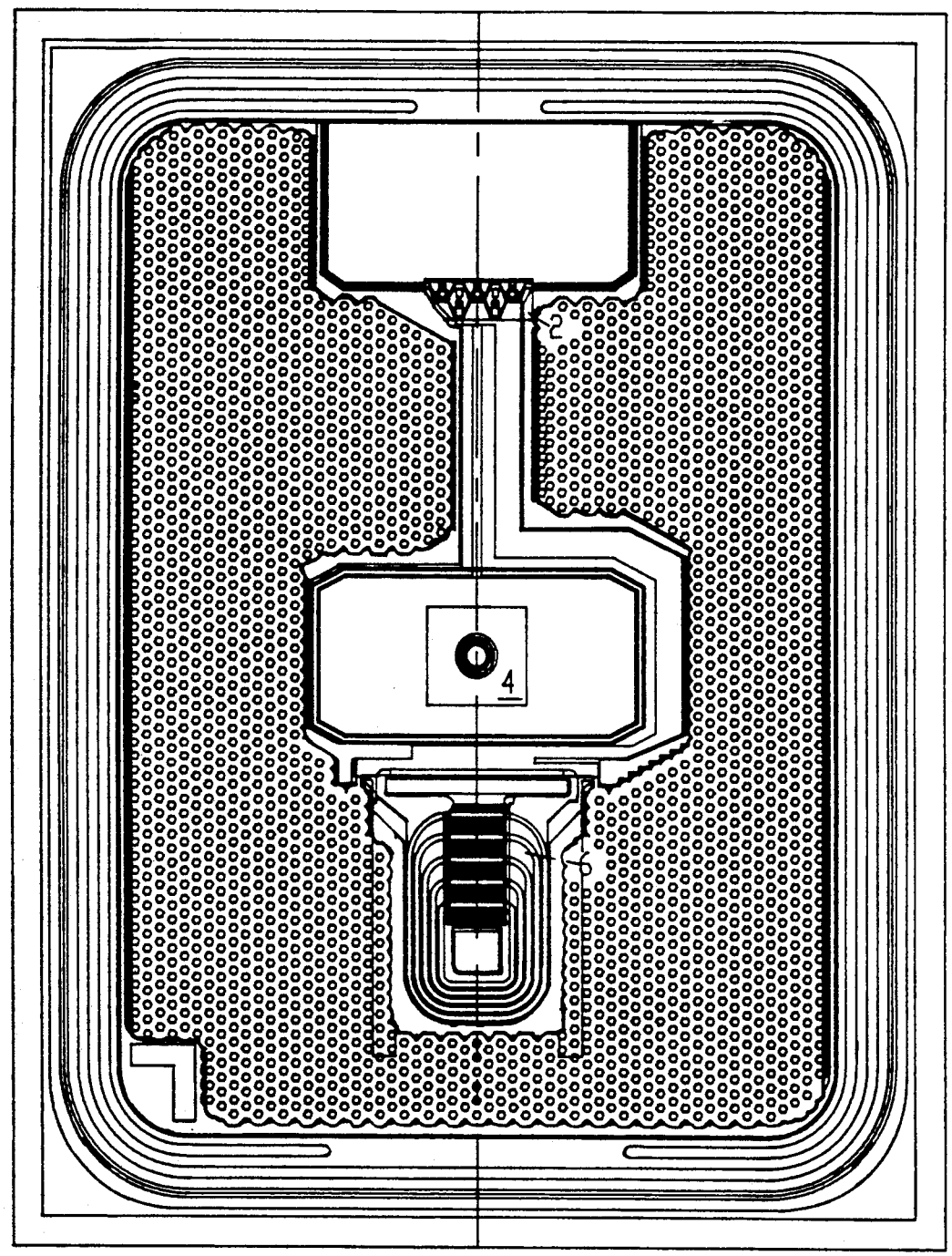
FIG. 2 is a plan view of the MOSFET in accordance with the present invention.

FIG. 2 shows in plan view a power MOSFET transistor including the circuit of FIG. 1, in accordance with the present invention. The matrix of dot-like hexagonally shaped elements forms the power MOSFET transistor, as will be explained below in greater detail. The area designated generally as area 2 comprises the current limiting circuitry in accordance with the invention. The ESD protection circuitry is generally designated as area 4, and the voltage clamp portion is generally designated as area 6.

Figure 3:
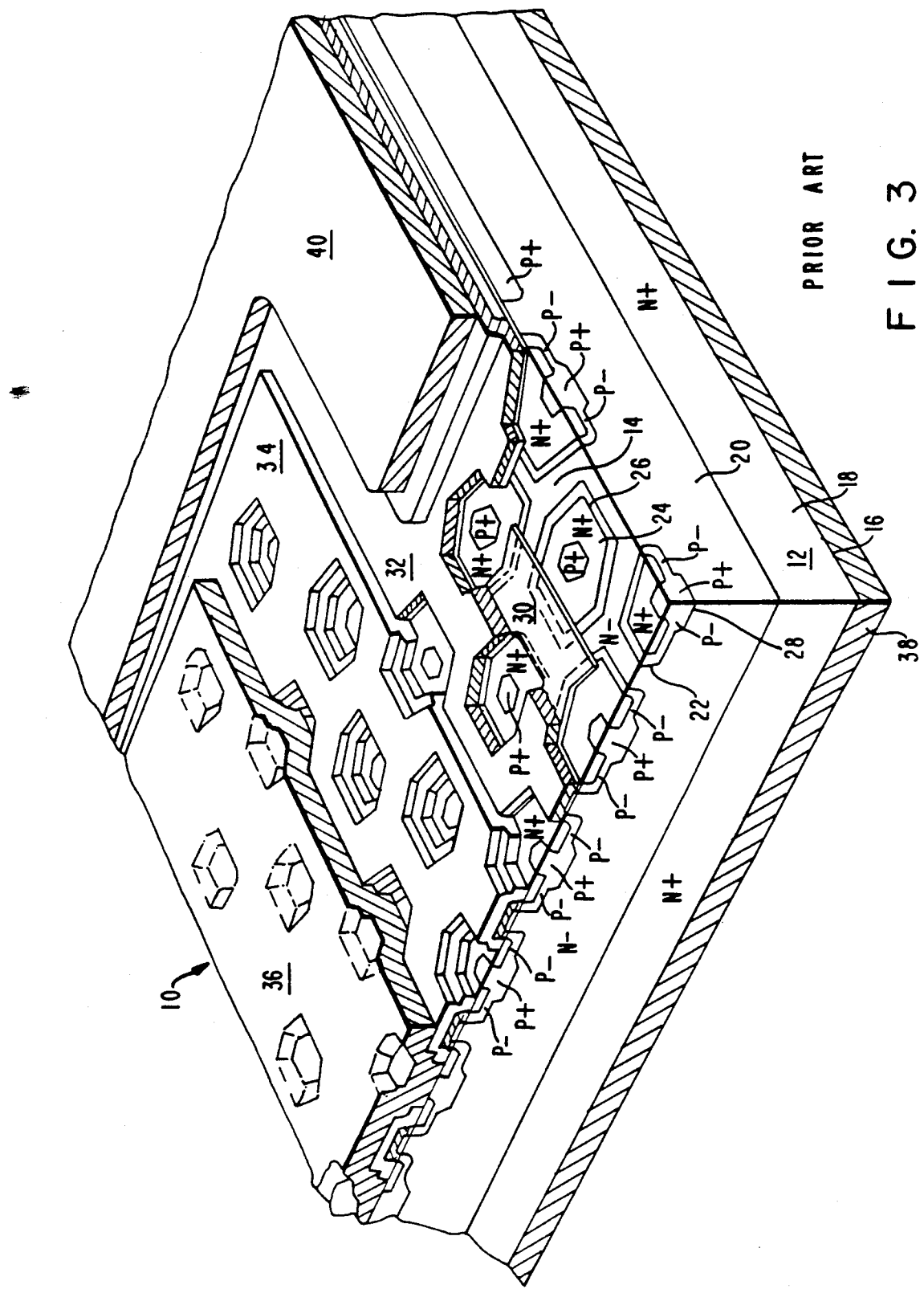
FIG. 3 is an isometric view in section, not to scale, of a portion of a power MOSFET of the prior art, helpful in understanding the present invention.

FIG. 3 is a larger scale view of a portion of the device shown in FIG. 2 and shows in isometric projection the construction of the FET device portion. Such a vertically diffused MOS (VDMOS) transistor is per se generally known in the prior art, for example, from the patent referred to above.

As shown in FIG. 3, a VDMOS transistor 10 basically comprises a substrate 12 of a semiconductor material, such as silicon, of one conductivity type, such as N-type, having first and second opposed major surfaces 14 and 16. Disposed across the second major surface 16 is a relatively high conductivity region 18 of the one conductivity type, such as N+ type, referred to as the drain region. Contiguous with the N+ type drain region 18 is an N− type extended drain region 20 which extends to the first major surface 14.

Extending into the substrate 12 from the first surface 14 are a plurality of lightly doped body regions 22 of the opposite conductivity type, such as P-type. At the first surface 14, each of the body regions 22 is in the form of a hexagon. Extending into the substrate 12 from the first surface 14 within the boundary of each of the body regions 22 is a source region 24 of the one conductivity type, such as N+ type. At the first surface 14, each of the source regions 24 is also hexagonal, with the edge of each source region 24 being spaced from the edge of its respective body region 22 so as to define the length and width of a channel region 26 at the first surface 14. Each of the source regions 24 is annular in shape and a P+ type supplementary body region 28 extends into the body region 22 within the source region 24 to a depth which may be greater or less than that of the body region 22.

Disposed on the first surface 14 over the channel regions 26 is an insulated gate electrode which comprises gate insulation 30 on the surface 14 and a gate electrode 32 on the gate insulation 30. The gate insulation 30 typically comprises silicon dioxide in the thickness range of approximately 500 to 2,000 Angstroms, and the gate electrode 32 typically comprises doped polycrystalline silicon. An insulating layer 34, typically comprising a silicate glass, overlies the gate electrode 32 so as to electrically isolate the electrode from overlying layers. A source electrode 36 overlies the insulating layer 34 and contacts the first surface 14 so as to contact the source regions and supplementary body regions 28. A drain electrode 38 contacts the high conductivity region 18 on the second surface 16. External electrical contact to the gate electrode 32 is made by a gate bond pad 40 which typically comprises a metal.

Figure 4:
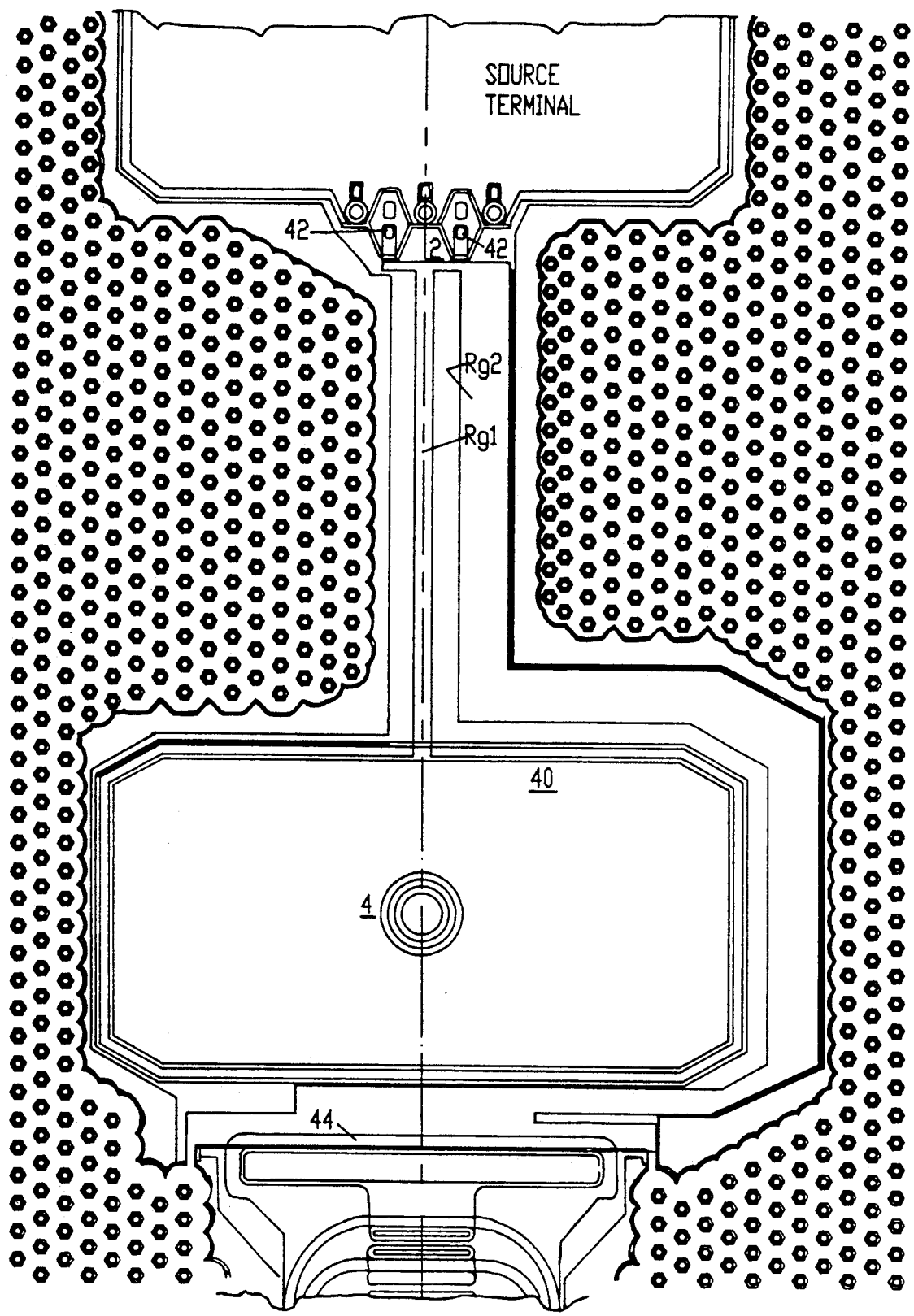
FIG. 4 is a plan view to a larger scale of a portion of the plan view of FIG. 2.

FIG. 4 shows, drawn to a larger scale, that portion of the structure shown in FIG. 2 which includes current limiting circuitry area 2 and ESD protection circuitry area 4. Resistance $R_{g1}$ is constructed of polysilicon and is shown as being connected between a gate bond pad 40 and the collector electrode 42 of $Q_1$. Resistance $R_{g2}$ is also of polysilicon and is shown as being connected between collector electrode 42 of transistor $Q_1$ and a contact connection 44 of the N+ anode region of polysilicon diode $D_3$. Resistance $R_{lim}$ is formed of aluminum in a plurality of parallel connected strips over a dielectric layer. It is contacted at one end by the SOURCE terminal and by the emitter of bipolar transistor $Q_1$ and at the other end by the source electrode of power MOSFET transistor $Q_2$ and by the base electrode of bipolar transistor $Q_1$.

Bipolar transistor $Q_1$ comprises a second well region of the opposite conductivity type extending into the substrate from the first surface serving as the base region, at least one region of the opposite conductivity type extending into the substrate from the first surface within the well region and serving as the collector electrode, and at least one region of the one conductivity type extending into the substrate from the first surface within the second well region and serving as the emitter electrode of the bipolar transistor.

Figure 5:
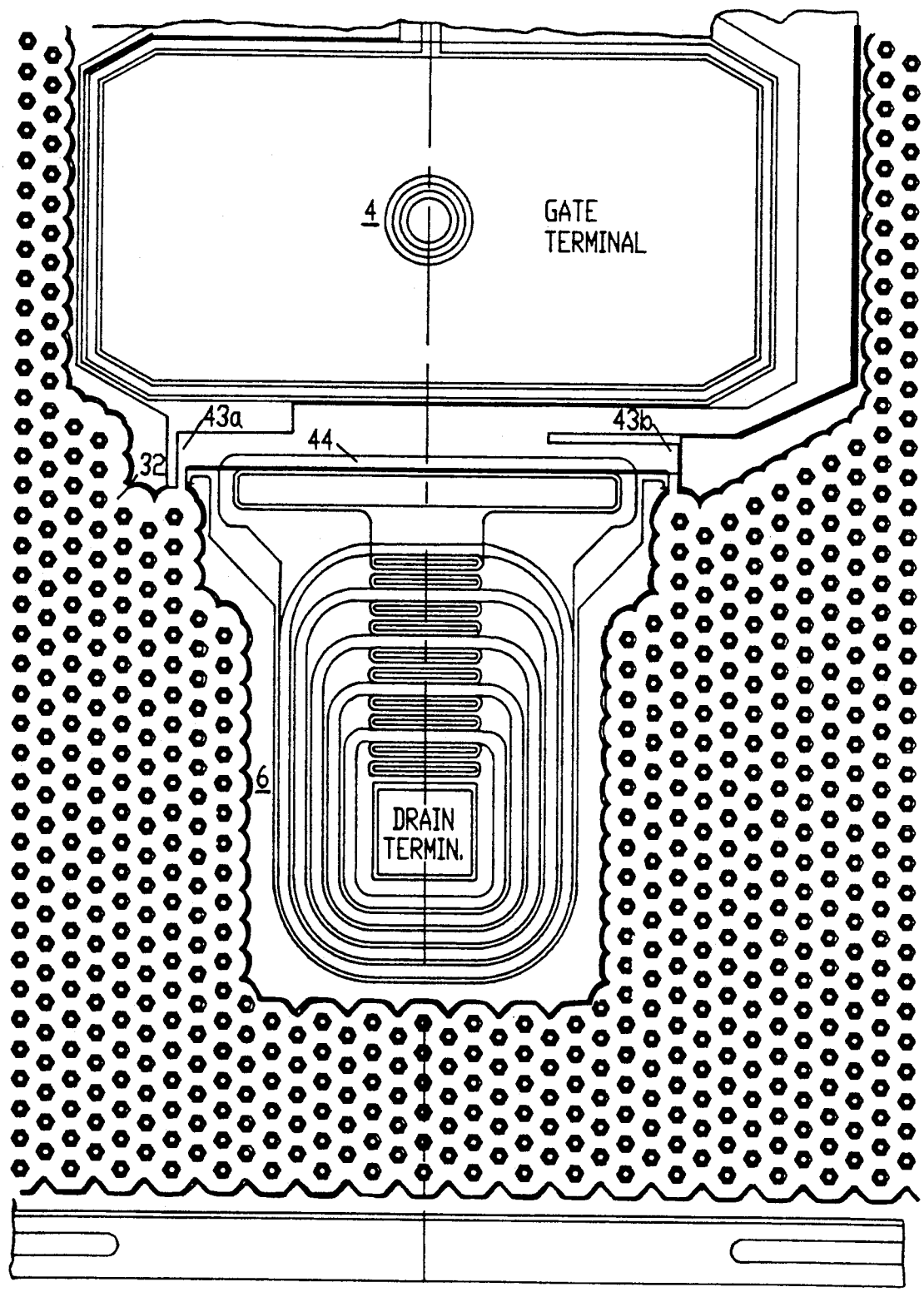
FIG. 5 is a plan view to a larger scale of another portion of the plan view of FIG. 2.

FIG. 5 shows, drawn to a larger scale, those portions of the structure shown in FIG. 2 which include the ESD protection circuitry area 4 and the voltage clamp portion area 6.

Figure 6A:
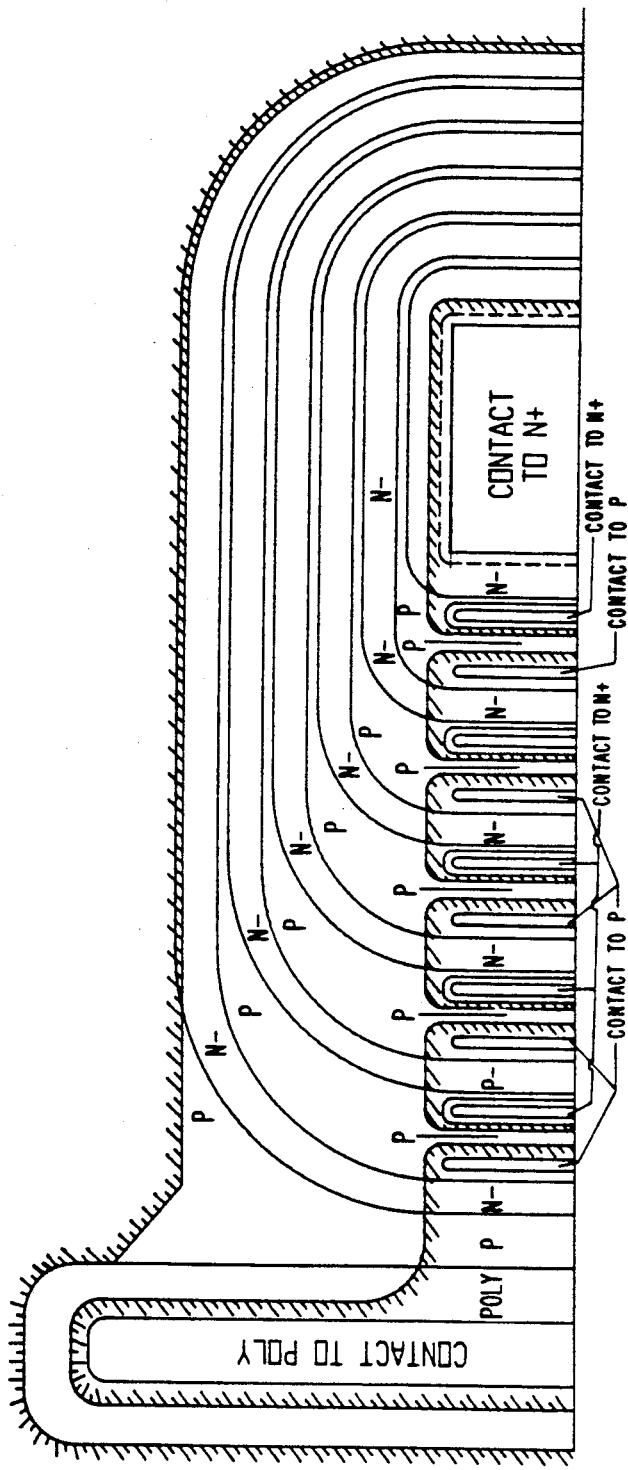
FIG. 6A is a top plan view of a portion of the MOSFET in accordance with the present invention.
Figure 6B:
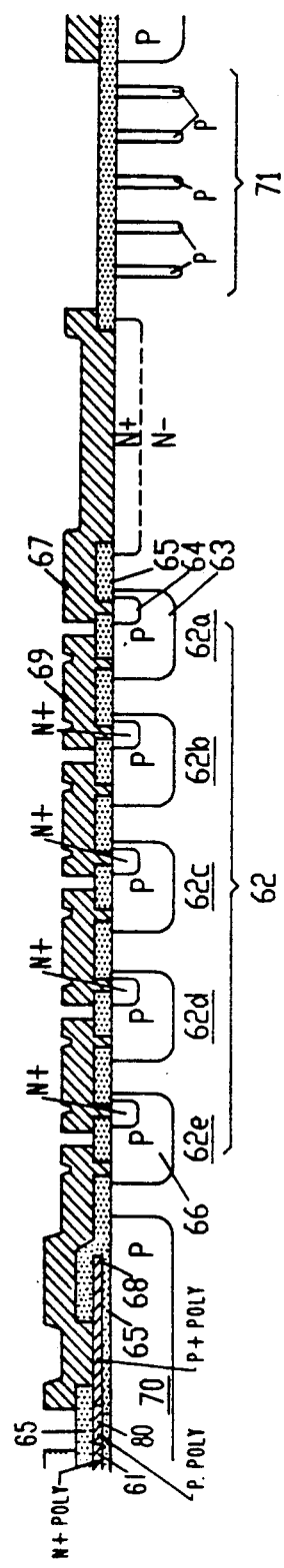
FIG. 6B is a sectioned view through the voltage clamp portion of the MOSFET in accordance with the present invention.

With reference to FIGS. 6A and 6B, polysilicon diode $D_3$ is shown as having a P-type polysilicon anode region 68, a polysilicon PN junction 80, a dielectric layer 65, and an N-type polysilicon cathode region 61 which is connected to the polysilicon material gate electrode by way of polysilicon material 43a and 43b. Zener diode $D_4$ generally indicated as 62 is shown to comprise a series chain connection of a plurality of individual diodes 62a through 62e. Each such individual diode comprises a P-type region having therein an N+-type region. As shown, the P-type regions are formed in successive ring-like structures surrounding a contact to the DRAIN region. The first individual diode 62a in the series chain has its N+-type region 64 connected to the DRAIN region by way of a conductor 67. Individual diode 62a has its P-type region 63 connected to the N+-type region of the next individual diode 62b by way of a conductor 69 overlying the dielectric layer 65, and so forth. The last individual diode 62e in the series chain has its P-type region 66 connected to the P-type polysilicon cathode region 68 of diode $D_3$. P-type rings 71 extending from each diode and surrounding the drain contact serve to distribute the voltage gradient due to the drain potential so as to avoid the formation of small localized areas of high electric field. The entire diode is surrounded by a P-type region 70 connected to the source electrode 36.

While the present invention has been described by way of an exemplary embodiment, various changes will be apparent to one skilled in the art to which it pertains. Thus, for example, variations may be made in the location and particular formation of the various components or, the material conductivity types may be interchanged, without departing from the spirit and scope of the invention as defined by the following claims.

What is claimed is:

1. A power MOS transistor, including source, drain, and gate electrodes, comprising:
   a substrate of a semiconductor material of one conductivity type having first and second opposed surfaces;
   a drain region extending through said substrate between said surfaces;
   a plurality of spaced body regions of the opposite conductivity type extending into said substrate from said first surface;
   a plurality of source regions of the one conductivity type extending into said substrate from said first surface within each of said body regions, the interface of each of said source regions with its respective body region at said first surface being spaced from the interface of its respective body region and the drain region at said first surface to form a channel region therebetween;
   a conductive gate overlying and being insulated from said first surface and extending across said channel regions;
   a conductive electrode extending over and being insulated from said gate electrode and contacting at least a portion of said source regions;
   a current limiting circuit coupled between said conductive electrode and the gate electrode; and
   a voltage limiting circuit coupled between said drain electrode and said gate electrode, including Zener diode means and a first diode connected in series, said Zener diode means and first diode being poled for passing current in opposite directions when forward biased, respectively.

2. A power MOS transistor in accordance with claim 1, wherein said zener diode means comprises at least one zener diode.

3. A power MOS transistor in accordance with claim 2, wherein said zener diode means comprises a plurality of zener diodes in series connection.

4. A power MOS transistor in accordance with claim 3, wherein each of said plurality of zener diodes comprises a first well region of said opposite conductivity type extending into said substrate from said first surface serving as one electrode and a region of the one conductivity type extending into said first well region serving as the other electrode.

5. A power MOS transistor in accordance with claim 4, wherein said first diode comprises a region of polysilicon of said first conductivity type serving as one electrode, and a region of polysilicon of the opposite conductivity type, in contact with said region of polysilicon of said first conductivity type, serving as the other electrode.

6. A power MOS transistor in accordance with claim 5, wherein said current limiting circuit comprises a bipolar transistor having emitter, collector, and base electrodes, said base electrode being connected to said conductive electrode, said emitter electrode being connected to a source terminal pad, said collector electrode being connected to said conductive gate and to a gate terminal pad; and a first resistance connected at one end thereof to said source terminal pad and at the other end thereof to said conductive electrode.

7. A power MOS transistor in accordance with claim 6, wherein said current limiting circuit comprises a second resistance connected between said gate terminal pad and said collector electrode of said bipolar transistor.

8. A power MOS transistor in accordance with claim 7, wherein said current limiting circuit comprises a third resistance connected between said collector electrode of said bipolar transistor and the common connection of said first diode and said gate electrode.

9. A power MOS transistor in accordance with claim 8, wherein said second and third resistances form a low-pass filter in cooperation with a circuit capacitance.

10. A power MOS transistor in accordance with claim 8, wherein said bipolar transistor comprises a second well region of the opposite conductivity type extending into said substrate from said first surface serving as the base region of said bipolar transistor, at least one region of the opposite conductivity type extending into the substrate from said first surface within the well region and serving as the collector electrode of said bipolar transistor, and at least one region of the one conductivity type extending into the substrate from said first surface within said second well region and serving as the emitter electrode of said bipolar transistor.

11. A power MOS transistor in accordance with claim 10, wherein said bipolar transistor comprises a plurality of said emitter regions and a respective collector region surrounding each emitter region.

12. A power MOS transistor in accordance with claim 11, wherein said first resistance comprises at least one strip of an electrically partially conductive material overlying and being insulated from said first surface over a portion of said second well region.

13. A power MOS transistor in accordance with claim 11, wherein said first resistance comprises a plurality of strips of an electrically conductive material overlying and being insulated from said first surface over a portion of said second well region.

14. A power MOS transistor in accordance with claim 13, wherein said second diode comprises a third well region of the opposite conductivity type in said substrate at said first surface and spaced from said second well region, and a region of the one conductivity type in the substrate at said first surface within said third well and forming a PN junction with said third well.

15. A power MOS transistor in accordance with claim 14, wherein said second resistance comprises a strip of a partially conductive material overlying and being insulated from said first surface and extending between said second and third well regions.

16. A power MOS transistor in accordance with claim 15, wherein said second resistance comprises a strip of the same material as said gate electrode.

17. A power MOS transistor in accordance with claim 16, wherein a strip of said first resistance makes contact with said conductive electrode and with said emitter region of said bipolar transistor, respectively.

18. A power MOS transistor in accordance with claim 17, wherein one end of a strip of said second resistance is electrically connected to the region of the one conductivity type of said second diode and connecting means connects the other end of said strip of said second resistance to said collector region of said bipolar transistor and said gate electrode.

19. A power MOS transistor in accordance with claim 18, wherein said first diode is of the same material as said gate electrode.

20. A power MOS comprising:

- a substrate of a semiconductor material of one conductivity type having first and second opposed surfaces;
- a drain region extending through said substrate between said surfaces;
- a plurality of spaced body regions of the opposite conductivity type in said substrate at said first surface, each of said body regions forming a body/drain junction with the drain region;
- a separate source region of the one conductivity type in said substrate at the first surface and within each body region, each of said source regions forming a source/body junction with its respective body region which is spaced from the body/drain junction of its respective body region to form a channel region therebetween along the first surface, each of the source regions and its respective body region forming a source/body cell;
- a conductive gate overlying and being insulated from said first surface and extending across the channel regions;
- a conductive electrode overlying and being insulated from said gate and contacting at least a portion of said source/body cells; .
- diode means comprising at least one zener diode in the substrate and a first diode;
- first and second resistors overlying and being insulated from said first surface;
- a bipolar transistor in said substrate at said first surface having a collector region, an emitter region and a base region;
- a second diode in said substrate;
- said zener diode means having one electrode thereof connected to said drain region;
- said first diode having one electrode thereof connected to the other electrode of said zener diode means, the other electrode of said first diode being connected to said gate electrode;
- said first resistor having one end thereof connected to said conductive electrode and to said base region of said bipolar transistor and the other end of said first resistor being connected to a source terminal, and to said emitter region of said bipolar transistor;
- the other end of said second diode being connected to a gate terminal and to one end of said second resistor;
- the other end of said second resistor being connected to said collector region of said bipolar transistor and to one end of a third resistor; and
- the other end of said third resistor being connected to said other electrode of said first diode and said gate electrode.

* * * * *